United States Patent
Plat et al.

(10) Patent No.: US 6,403,456 B1
(45) Date of Patent: *Jun. 11, 2002

(54) T OR T/Y GATE FORMATION USING TRIM ETCH PROCESSING

(75) Inventors: Marina Plat, San Jose; Christopher F. Lyons, Fremont; Bhanwar Singh, Morgan Hill; Ramkumar Subramanian, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 44 days.

This patent is subject to a terminal disclaimer.

(21) Appl. No.: 09/643,611

(22) Filed: Aug. 22, 2000

(51) Int. Cl.[7] .......................... H01L 21/28; H01L 21/44
(52) U.S. Cl. ..................... 438/579; 438/574; 438/578
(58) Field of Search ................... 438/167, 182, 438/573, 574, 576, 578, 579, 666

(56) References Cited

U.S. PATENT DOCUMENTS

| | | | | |
|---|---|---|---|---|
| 4,700,462 A | * | 10/1987 | Beaubien et al. .......... | 438/574 |
| 4,980,316 A | | 12/1990 | Huebner | |
| 4,997,778 A | * | 3/1991 | Sim et al. ................. | 438/182 |
| 5,155,053 A | | 10/1992 | Atkinson | |
| 5,334,542 A | * | 8/1994 | Saito et al. ............... | 438/582 |
| 5,496,779 A | * | 3/1996 | Lee et al. ................. | 438/185 |
| 5,563,079 A | * | 10/1996 | Shin et al. ................ | 438/571 |
| 5,567,647 A | * | 10/1996 | Takahashi ................. | 438/573 |
| 5,677,089 A | | 10/1997 | Park et al. | |
| 5,766,967 A | * | 6/1998 | Lai et al. .................. | 438/167 |
| 5,858,824 A | * | 1/1999 | Saitoh ...................... | 438/167 |
| 5,930,610 A | | 7/1999 | Lee | |
| 5,981,319 A | * | 11/1999 | Lothian et al. ........... | 438/167 |
| 6,077,733 A | * | 6/2000 | Chen et al. ............... | 438/182 |
| 6,139,995 A | * | 10/2000 | Burm et al. .............. | 438/167 |
| 6,204,102 B1 | * | 3/2001 | Yoon et al. ............... | 438/182 |
| 6,255,202 B1 | * | 7/2001 | Lyons et al. ............. | 438/585 |
| 6,270,929 B1 | * | 8/2001 | Lyons et al. ............. | 438/725 |
| 6,313,019 B1 | * | 11/2001 | Subramanian et al. ..... | 438/585 |

* cited by examiner

Primary Examiner—Mathew S. Smith
Assistant Examiner—Lex H Malsawma
(74) Attorney, Agent, or Firm—Amin & Turocy, LLP

(57) ABSTRACT

A method for fabricating a T-gate structure is provided. The method comprises the steps of providing a silicon layer having a gate oxide layer, a protection layer over the gate oxide layer, a first sacrificial layer over the protection layer and a second sacrificial layer over the first sacrificial layer. A photoresist layer is formed over the second sacrificial layer. An opening is formed in the photoresist layer. An opening is then formed in the second sacrificial layer beneath the opening in the photoresist layer. The opening is then expanded in the photoresist layer to expose portions of the top surface of the second sacrificial layer around the opening in the second sacrificial layer. The opening is extended in the second sacrificial layer through the first sacrificial layer and the opening is expanded in the second sacrificial layer to form a T-shaped opening in the first and second sacrificial layers. The photoresist layer is removed and the T-shaped opening is filled with a conductive material.

20 Claims, 7 Drawing Sheets

T OR T/Y GATE FORMATION USING TRIM ETCH PROCESSING

TECHNICAL FIELD

The present invention generally relates to semiconductor processing, and in particular to a method for forming a gate structure with a contact area wider than a base area.

BACKGROUND OF THE INVENTION

Historically, gate structures having a base area with a width that is smaller than the gate contact area (e.g., T-gate and Y-gate structures) have been advantageous in several technologies. For example, MESFET, HEMT (variant of gallium arsenide field effect transistor technology) mainly used in satellite broadcasting receivers, high speed logic circuits and power modules have employed gate structures with bases smaller than the contact area. These types of devices are required in field effect transistors for operation in ultra-high frequency ranges. The advantage of employing a gate structure with a shorter gate length is that the channel of the gate is reduced resulting in an increased in speed and a decrease in power consumption. Reducing the distance over which the gate's field effect control of the electrons in the channel reduces the parasitic resistances and capacitances that limit device speed. A shorter gate length decreases the transmit time for carriers in the channel but also increases the series resistance of the gate electrode itself, slowing down the device and degrading the frequency characteristics of the device. Providing a gate structure with a smaller base than its contact area decreases the gate channel while providing a low gate series resistance due to the wider contact area and, thus, improving the devices drive current capability and performance.

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. This may include the width and spacing of interconnecting lines and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Recent advances in CMOS transistor architecture make use of the T-gate or Y-gate structures where the polysilicon gate electrode is narrowed in the gate regions and wider on top of the gate. This is due to the ever increasing demand for scaling down semiconductor devices and scaling down power consumption requirements. However, the current methods for forming a gate structure with a contact region wider than its base suffers from shortcomings. For example, the etch process which narrows the base of the structure are known to be difficult to control especially with local pattern density. This can lead to variation in the gate width and asymmetric implant profiles. Another problem is related to manufacturing controls. The "re-entrant" or overhung profile prevents direct measurement of the critical gate length.

In view of the above, there is an unmet need for improvements in methodologies for formation of gate structures with contact areas that are wider than the base area.

SUMMARY OF THE INVENTION

One aspect of the invention relates to a method for fabricating a T-gate structure. The method comprises the steps of providing a silicon layer having a gate oxide layer, a protection layer over the gate oxide layer, a first sacrificial layer over the protection layer and a second sacrificial layer over the first sacrificial layer. A photoresist layer is formed over the second sacrificial layer. An opening is formed in the photoresist layer. An opening is then formed in the second sacrificial layer beneath the opening in the photoresist layer. The opening is then expanded in the photoresist layer to expose portions of the top surface of the second sacrificial layer around the opening in the second sacrificial layer. The opening is extended in the second sacrificial layer through the first sacrificial layer and the opening is expanded in the second sacrificial layer to form a T-shaped opening in the first and second sacrificial layers. The photoresist layer is removed and the T-shaped opening is filled with a conductive material.

Another aspect of the present invention relates to another method for fabricating a T-gate structure. The method comprises the steps of providing a silicon layer having a gate oxide layer, a protection layer over the gate oxide layer and a single sacrificial layer over the protection layer. A photoresist layer is formed over the single sacrificial layer. An opening is formed in the photoresist layer exposing a portion of the single sacrificial layer. The exposed portion of the single sacrificial layer is etched to extend the opening partially into the single sacrificial layer. The opening in the single sacrificial layer extends from a top surface of the single sacrificial layer to a first depth. The opening is expanded in the photoresist layer to expose portions of the top surface of the single sacrificial layer around the opening in the single sacrificial layer. The expanded opening in the photoresist layer is etched to extend the opening of the single sacrificial layer through the single sacrificial layer to the protection layer and the opening is expanded in the single sacrificial layer at the first depth to form a T-shaped opening in the single sacrificial layer. The photoresist layer is removed and the T-shaped opening filled with a conductive material.

Yet another aspect of the present invention provides for yet another method for fabricating a T-gate structure. The method comprises the steps of providing a silicon layer having a gate oxide layer, a protection layer over the gate oxide layer, a first sacrificial layer over the protection layer and a second sacrificial layer over the first sacrificial layer. A photoresist layer is formed over the second sacrificial layer. An opening is etched in the photoresist layer exposing a portion of the second sacrificial layer. The etching is highly selective to the photoresist layer over the underlying second sacrificial layer. The exposed portion of the second sacrificial layer is etched to extend the opening into the second sacrificial layer. The etching is highly selective to the second sacrificial layer over the photoresist layer and the underlying first sacrificial layer. The opening is expanded in the photoresist layer to expose portions of the top surface of the second sacrificial layer around the opening in the second sacrificial layer using an oxygen plasma etch. The opening of the second sacrificial layer is etched through the first sacrificial layer and the opening in the second sacrificial layer expanded to form a T-shaped opening in the first and second sacrificial layers. The etching is highly selective to the second sacrificial layer and the first sacrificial layer over the photoresist layer and the underlying protection layer. The photoresist layer is removed and the T-shaped opening filled with a conductive material. The first and second sacrificial layers are removed employing an anisotropic gaseous stripping process. The protection layer and the gate oxide layer not forming a part of the T-gate structure are removed by performing a wet etch on the protection layer and the gate oxide layer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
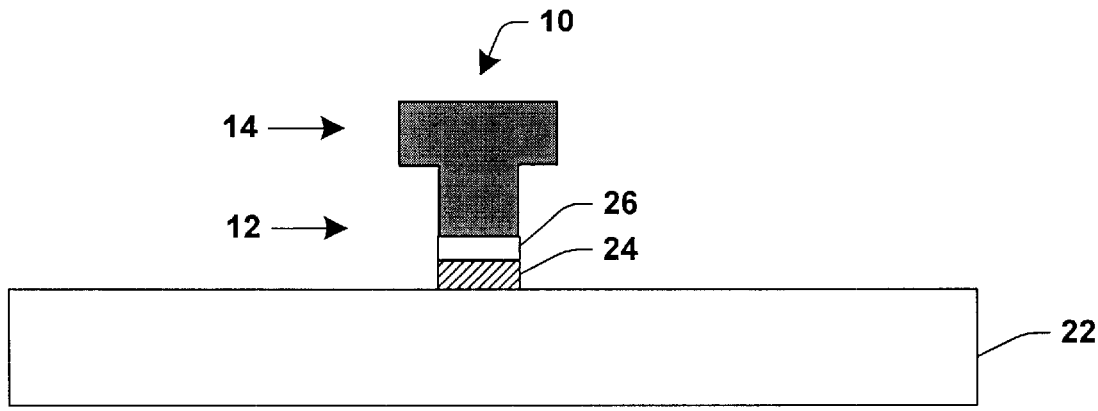
FIG. 1 is a schematic cross-sectional illustration of a T-gate structure overlying a silicon layer in accordance with one aspect of the invention.

The present invention will now be described with reference to the drawings, wherein like reference numerals are used to refer to like elements throughout. The present invention is described with reference to a method for forming a T-gate structure over a silicon layer to form a semiconductor with more speed and less power consumption. It is to be understood that the description of the various aspects of the present invention are merely illustrative and that they should not be taken in a limiting sense.

FIG. 1 illustrates a T-gate structure 10 according to the present invention. The T-gate structure 10 resides over a silicon layer 22 and includes a base portion 12 and a top or contact portion 14. The base portion 12 has a gate oxide layer 24 and a silicon layer 26. The top or contact portion 14 is the gate contact area and can be comprised of polysilicon, germanium, amorphous silicon, metals or the like. The base portion 12 has a width that is smaller than the top portion 14.

Figure 2:
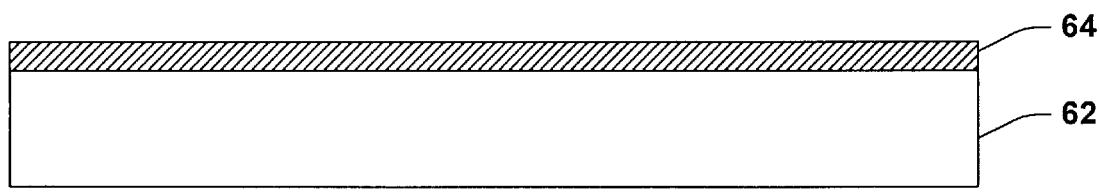
FIG. 2 is a schematic cross-sectional illustration of a silicon layer having a gate oxide layer in accordance with one aspect of the present invention.
Figure 3:
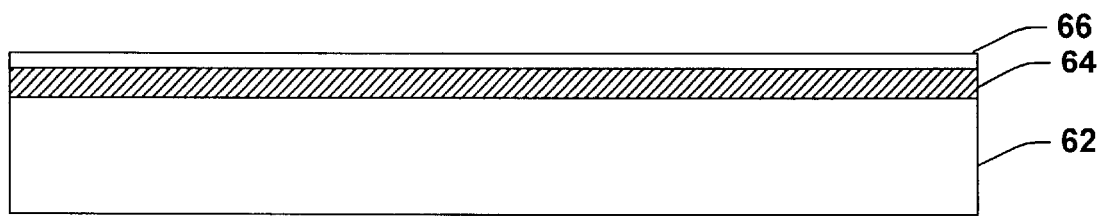
FIG. 3 is a schematic cross-sectional illustration of the structure of FIG. 2 having a protection layer over the gate oxide layer in accordance with one aspect of the present invention.

FIGS. 2–14 illustrate a methodology of fabricating the T-gate structure of the present invention. FIG. 2 illustrates a structure 60 having a gate oxide layer 64 disposed over a silicon layer 62. The thin gate oxide material 64 is formed to have a thickness within the range of about 10–20 Å. Preferably, the thin gate oxide material 64 includes $SiO_2$ which has a substantially low dielectric constant. However, it is to be appreciated that any suitable material (e.g., $Si_3N_4$) for carrying out the present invention may be employed and is intended to fall within the scope of the present invention. A thin protection layer 66 is formed over the gate oxide material 64, as illustrated in FIG. 3. The thin protection layer 66 may be formed from polysilicon. Alternatively, the thin protection layer 66 may be formed from germanium. Preferably, the protection layer 66 is doped prior to the formation of the protection layer 66 over the gate oxide material 64. The protection layer 66 may have a thickness within the range of about 50 Å–150 Å.

Figure 4:
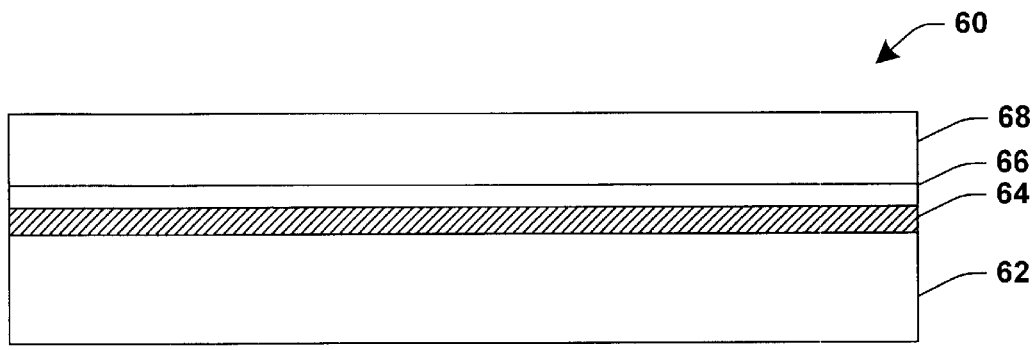
FIG. 4 is a schematic cross-sectional illustration of the structure of FIG. 3 having a first sacrificial layer over the protection layer in accordance with one aspect of the present invention.
Figure 5:
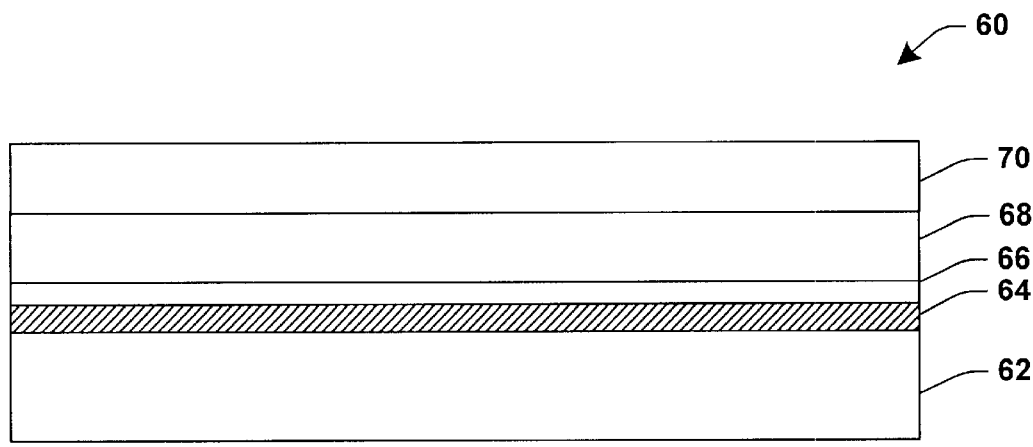
FIG. 5 is a schematic cross-sectional illustration of the structure of FIG. 4 having a second sacrificial layer over the first sacrificial layer in accordance with one aspect of the present invention.

A first sacrificial layer 68 is formed over the thin protection layer 66 (FIG. 4). A second sacrificial layer 70 is formed over the first sacrificial layer 68 (FIG. 5). Any suitable technique (e.g., thermal oxidation, plasma enhanced chemical vapor deposition (CVD), thermal enhanced CVD and spin on techniques) may be employed in forming the sacrificial layers 68 and 70. Sacrificial layers 68 can be silicon dioxide ($SiO_2$) and the sacrificial layer 70 can be silicon nitride (SiN). Preferably, each sacrificial layer has a thickness within the range of about 400–600 Å. Other usuable sacrificial materials may be employed such as silicon nitride ($Si_3N_4$), silicon oxynitride ($SiO_xN_y$), and fluonated silicon oxide ($SiO_xF_y$), and polyimide(s). Preferably, the second sacrificial layer 70 is of a different material than the first sacrificial layers 68, so that separate etching steps can be performed on the sacrificial layers.

Figure 6:
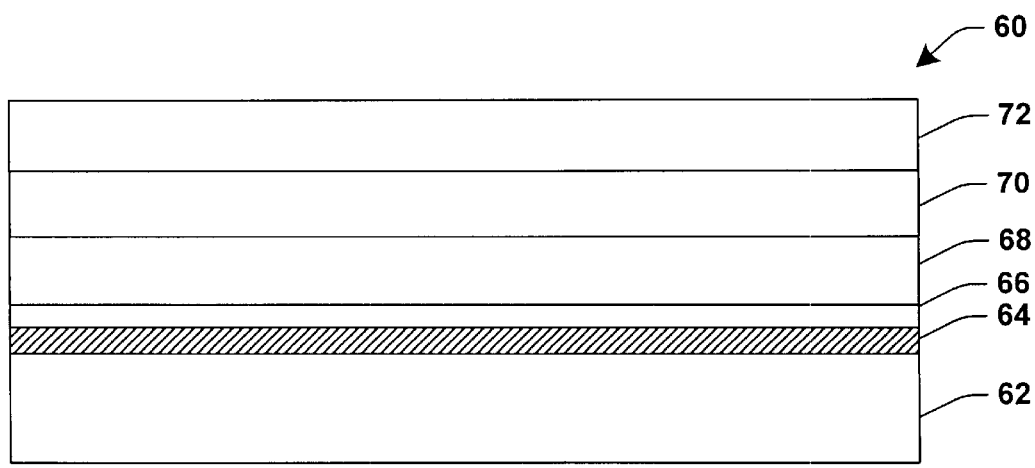
FIG. 6 is a schematic cross-sectional illustration of the structure of FIG. 5 having a photoresist layer over the second sacrificial layer in accordance with one aspect of the present invention.
Figure 7:
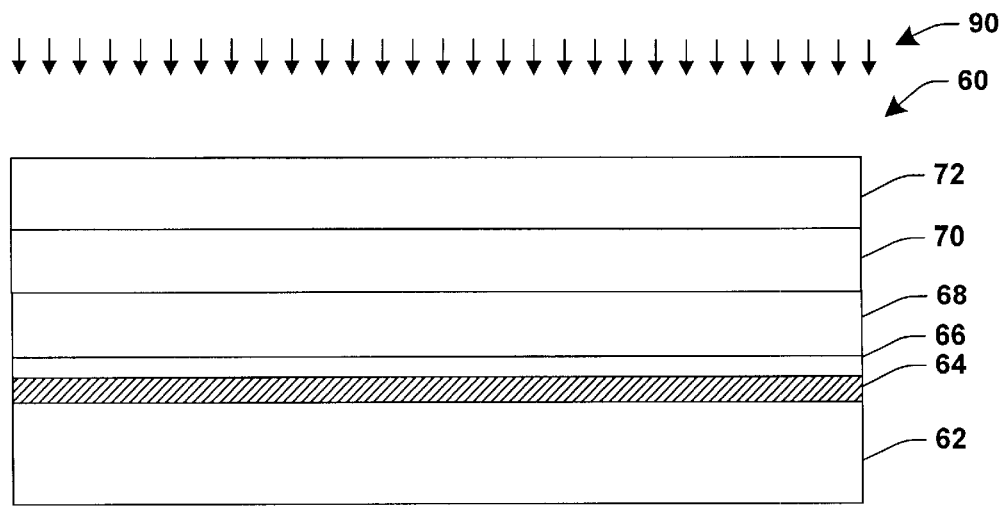
FIG. 7 is a schematic cross-sectional illustration of the structure of FIG. 6 undergoing an etching step in accordance with one aspect of the present invention.

A photoresist layer 72 is formed on the second sacrificial layer 68 as illustrated in FIG. 6. The photoresist layer 72 can have a thickness of about 1000 Å–15,000 Å, however, it is to be appreciated that the thickness thereof may be of any dimension suitable for carrying out the present invention. Accordingly, the thickness of the photoresist layer 72 can vary in correspondence with the wavelength of radiation used to pattern the photoresist layer 72. One aspect of the present invention provides for forming the photoresist layer 72 to have a thickness within the range of 1000 Å to 12,000 Å. Another aspect of the present invention provides for forming the photoresist layer 72 to have a thickness within the range of 2000 Å to 10,000 Å. Yet another aspect of the present invention provides for forming the photoresist layer 72 to have a thickness within the range of 2000 Å to 8000 Å. The photoresist layer 72 may be formed over the sacrificial layer 70 via conventional spin-coating or spin casting deposition techniques.

Figure 8:
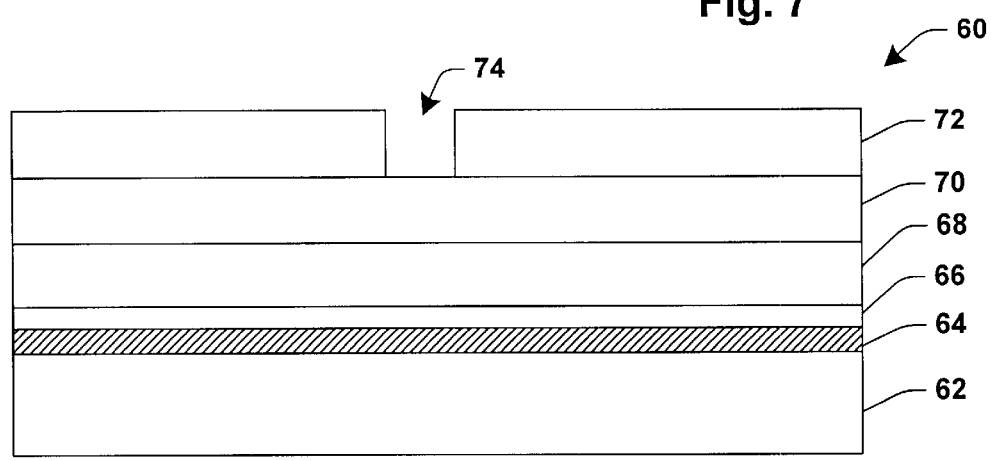
FIG. 8 is a schematic cross-sectional illustration of the structure of FIG. 7 after the photoresist layer has been etched in accordance with one aspect of the present invention.
Figure 9:
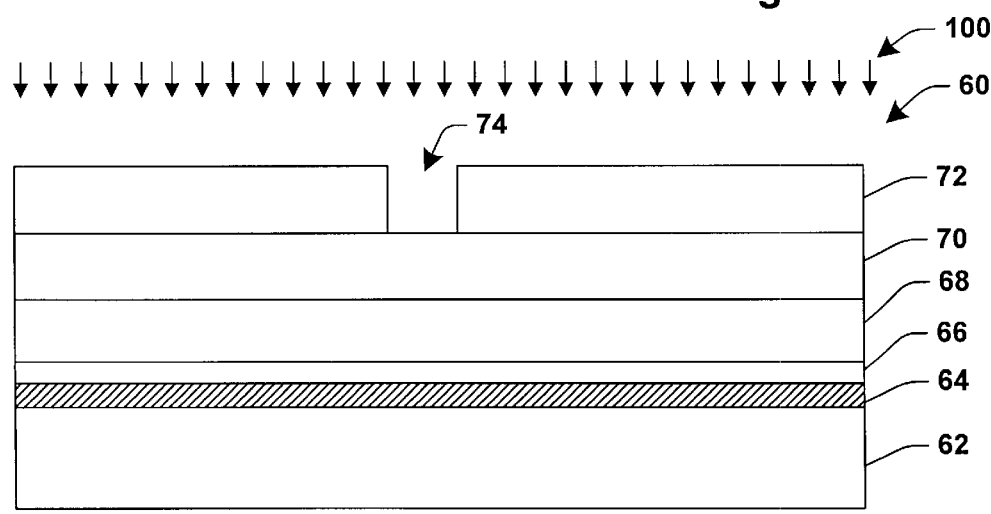
FIG. 9 is a schematic cross-sectional illustration of the structure of FIG. 8 undergoing another etching step in accordance with one aspect of the present invention.

An etch step 90 (e.g., anisotropic reactive ion etching (RIE)) (FIG. 7) is performed to form an opening 74 in the photoresist layer 72 (FIG. 8). The photoresist layer 72 is patterned and is used as a mask for selectively etching the second sacrificial layer 70. Preferably, a selective etch technique is used to etch the material of the photoresist layer 72 at a relatively greater rate as compared to the rate that the material of the second sacrificial layer 70. The photoresist layer 72 is etched using a dark field mask employing a positive resist or in the alternative with a clear field mask with a negative resist to form the opening in the photoresist. Any suitable etch technique may be used to etch the photoresist layer 72. For example, the photoresist layer 72 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor.

Figure 10:
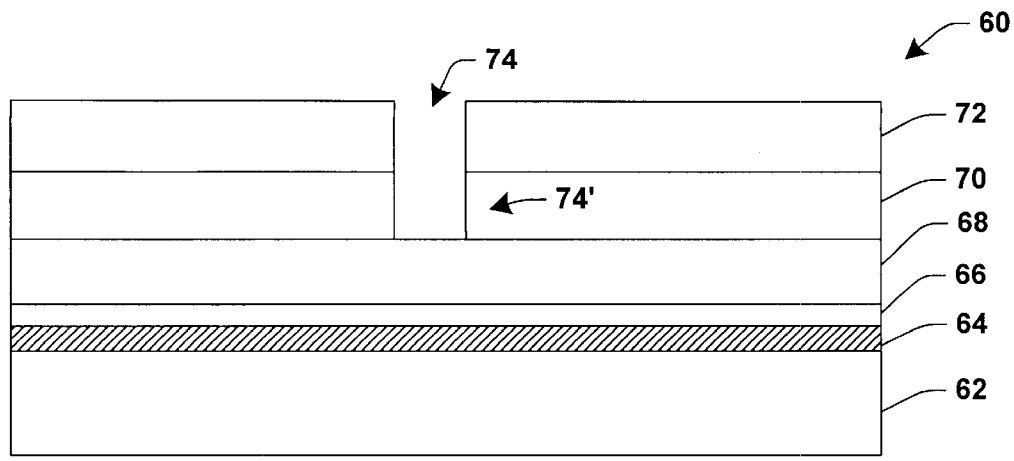
FIG. 10 is a schematic cross-sectional illustration of the structure of FIG. 9 after the second sacrificial layer has been etched in accordance with one aspect of the present invention.

An etch step 100 (e.g., anisotropic reactive ion etching (RIE)) (FIG. 9) is performed to form an opening 74' in the second sacrificial layer 70 (FIG. 10). The photoresist layer is used as a mask for selectively etching the second sacrificial layer 70 to provide the opening 74' in the second sacrificial layer 70. Any suitable etch technique may be used to etch the second sacrificial layer 70. For example, the second sacrificial layer 72 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor. Preferably, a selective etch technique is used to etch the material of the second sacrificial layer 70 at a relatively greater rate as compared to the rate that the material of the patterned photoresist 72 and at a relatively greater rate as compared to the rate that the material of the underlying first sacrificial layer 68 to replicate the mask pattern of the photoresist layer 72 to thereby create the opening 74' in the second sacrificial layer 70. In an alternate aspect of the invention, the second sacrificial layer 70 and the first sacrificial layer 68 are formed from a single sacrificial layer. The single sacrificial layer is partially etched in the etch step 100 from the top surface of the single sacrificial layer to a first depth, so that a portion of the single sacrificial layer remains below the first opening 74.

Figure 11:
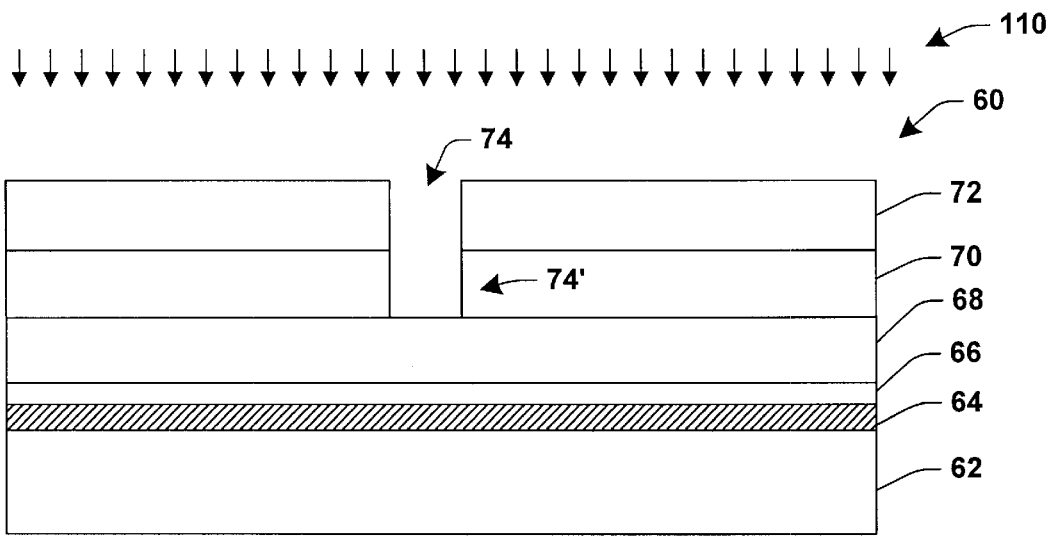
FIG. 11 is a schematic cross-sectional illustration of the structure of FIG. 10 undergoing yet another etching step to expand the opening in the photoresist layer in accordance with one aspect of the present invention.

FIG. 11 illustrates the structure 60 after the resist layer 72 undergoes a second resist etching step so that the resist opening 74 is expanded to form a larger opening 76 (FIG. 12), so a portion of the top surface of the underlying second sacrificial layer 70 is exposed around the opening 74'. Preferably, the second etching step is an oxygen plasma etch. If a single sacrificial layer is employed the resist opening 74 is expanded to form a larger opening 76, so a portion of the top surface of the underlying single sacrificial layer is exposed around the opening 74'.

Figure 14:
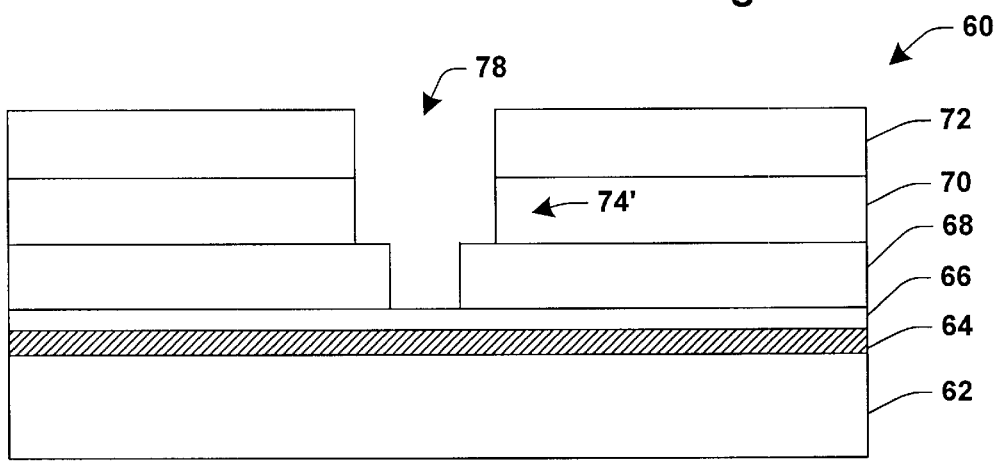
FIG. 14 is a schematic cross-sectional illustration of the structure of FIG. 13 after undergoing the etching step to expand the opening in the second sacrificial and extend the opening through the first sacrificial layer in accordance with one aspect of the present invention.

Another etch step 120 (e.g., anisotropic reactive ion etching (RIE)) (FIG. 13) is performed to extend the opening 74' into the first sacrificial layer 68 and expand the opening 74' at the second sacrificial layer 70 (FIG. 14). Any suitable etch technique may be used to etch the first and second sacrificial layers 68 and 70, respectively. For example, the first sacrificial layer 68 and the second sacrificial layer 70 at the opening 76 are anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to thereby extend the opening 74' in the first sacrificial layer 68 and expand the opening 74' at the second sacrificial layer 70. Preferably, a selective etch technique is used to etch the material of the first and second sacrificial layers 68 and 70 at a relatively greater rate as compared to the rate that the material of the patterned photoresist 72 and an etch technique that etches the first and second sacrificial layers 68 and 70 at a similar rate to form a T-shaped opening 78.

Figure 15:
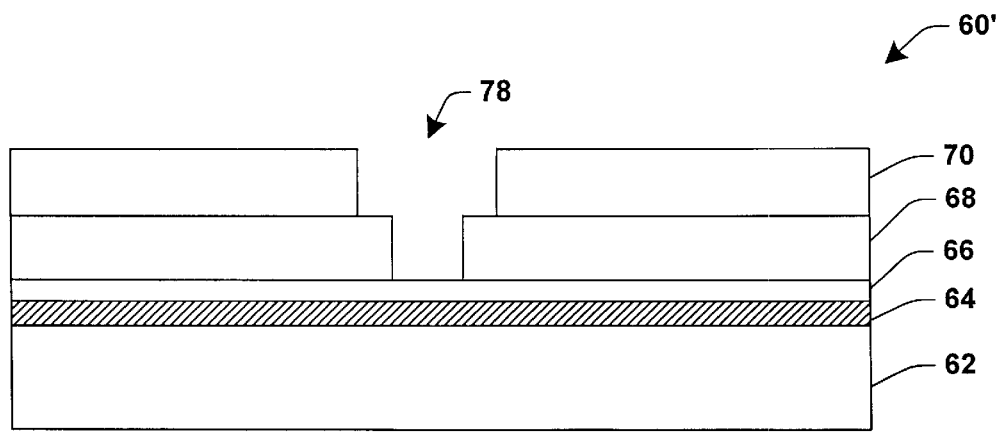
FIG. 15 is a schematic cross-sectional illustration of the structure of FIG. 14 after the photoresist layer has been stripped in accordance with one aspect of the present invention.
Figure 16:
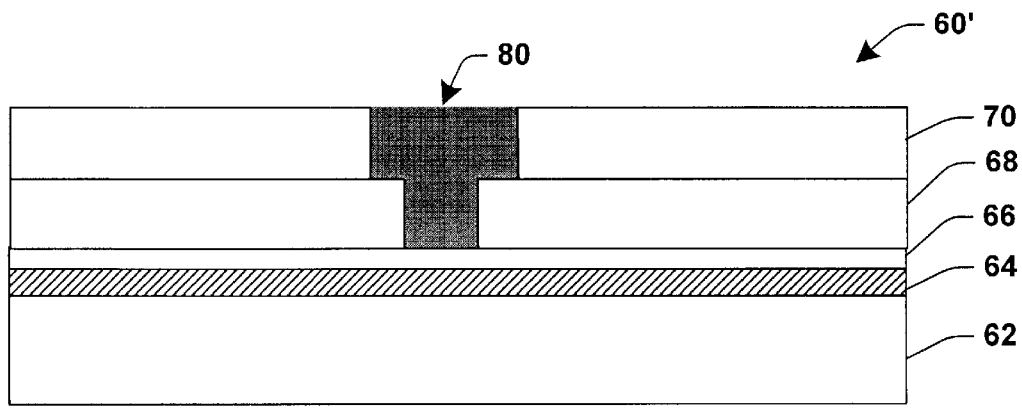
FIG. 16 is a schematic cross-sectional illustration of the structure of FIG. 15 after a deposition step in accordance with one aspect of the present invention.

FIG. 15 illustrates a partially complete structure 60' after a stripping step (e.g., ashing in an $O_2$ plasma) is substantially complete for removing the remaining portions of the photoresist layer 72. Next, a damascene fill or deposition step is performed on the structure 60' (FIG. 16) to form a T-gate structure 80 in the structure 60'. The T-gate structure 80 can be comprised of polysilicon, amorphous silicon, germanium, metals or the like. If the T-gate structure 80 is comprised of polysilicon, a contact layer may be formed using any suitable technique including chemical vapor deposition (CVD) techniques, such as low pressure chemical vapor deposition (LPCVD) or plasma enhanced chemical vapor deposition (PECVD). If the T-gate structure 80 is comprised of amorphous silicon or germanium, standard deposition techniques may be employed. If the contact layer is comprised of a metal, standard sputtering techniques may be employed. After formation of the contact layer, the contact layer is polished down to the underlying sacrificial layer to form the T-gate structure 80.

Figure 17:
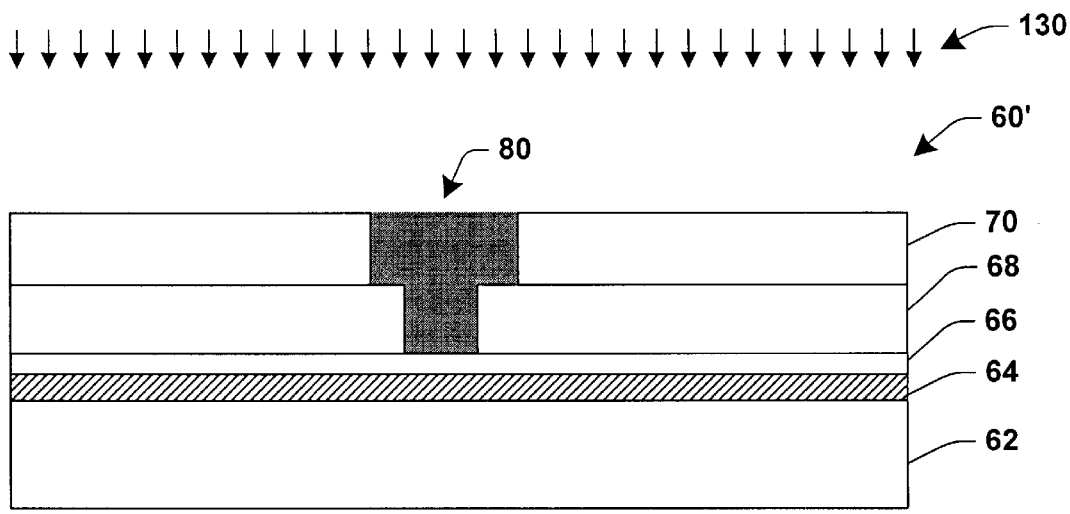
FIG. 17 is a schematic cross-sectional illustration of the structure of FIG. 16 undergoing a stripping step in accordance with one aspect of the present invention.
Figure 18:
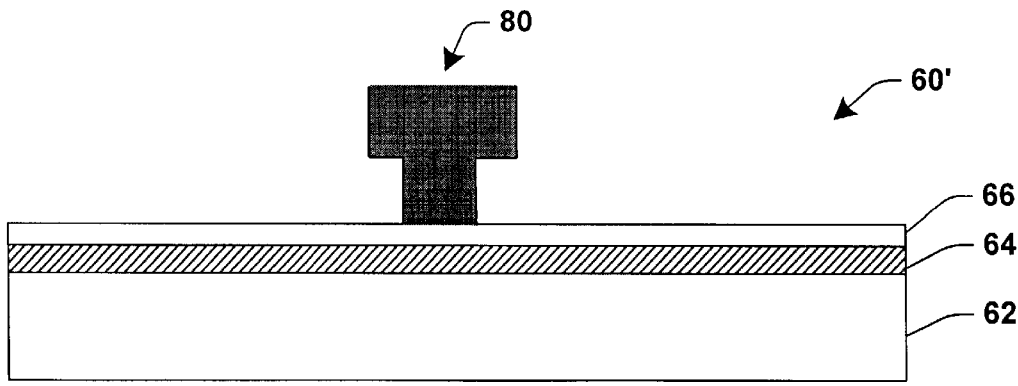
FIG. 18 is a schematic cross-sectional illustration of the structure of FIG. 17 after undergoing a stripping step in accordance with one aspect of the present invention.
Figure 19:
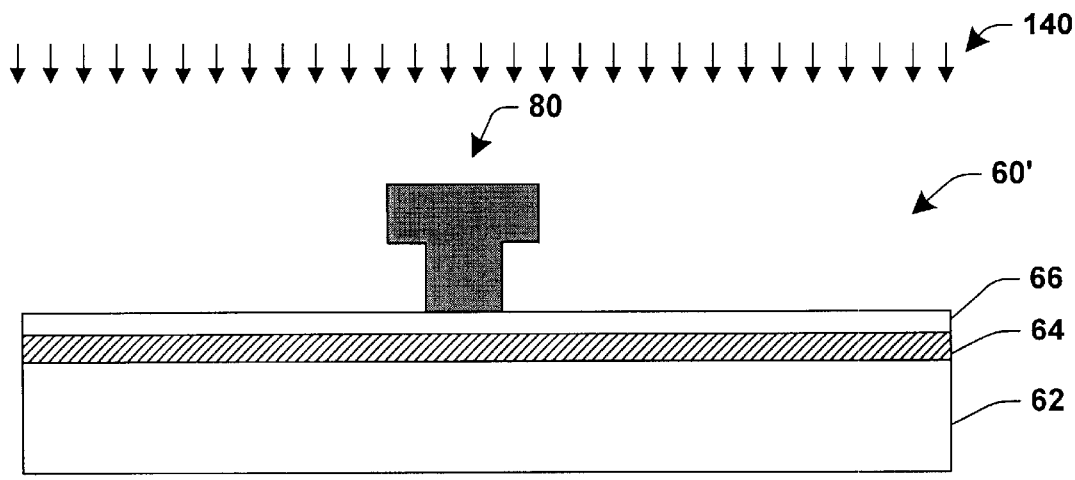
FIG. 19 is a schematic cross-sectional illustration of the structure of FIG. 18 undergoing a protection layer and a gate oxide layer removal step in accordance with one aspect of the present invention.
Figure 20:
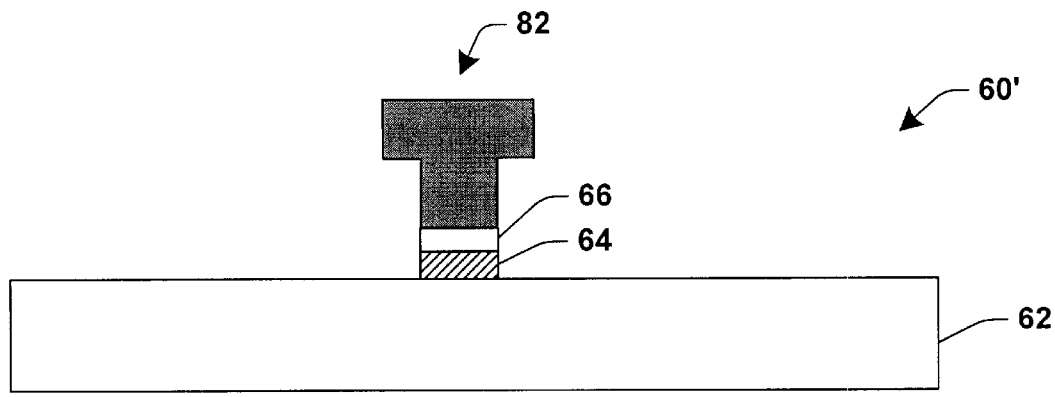
FIG. 20 is a schematic cross-sectional illustration of the structure of FIG. 19 after undergoing a protection layer and a gate oxide layer removal step in accordance with one aspect of the present invention.

A stripping step 130 (FIG. 17) is then performed to remove the first and second sacrificial layers 68 and 70, respectively, to form the structure 60', as illustrated in FIG. 18. The stripping step 130 may be an anisotropic gaseous stripping process. After the sacrificial layers are removed an etch step 140 is performed (FIG. 19) to remove portions of the protection layer 66 and the gate oxide layer 64 that do not form part of the gate structure 80. The etch step 140 may be a wet etch, for example, hydrofluoric acid (HF) may be employed via an HF dip to remove portions of the protection layer 66 and the gate oxide layer 64 that do not form part of the gate structure 80. However any suitable wet etch technique can be utilized to remove portions of the protection layer 66 and the gate oxide layer 64 that do not form part of the gate structure 80. Alternatively, the etch step 140 may be a vertical plasma etch. If the protection layer 66 is germanium and the contact layer polysilicon, it may be easier to remove the germanium as compared to a protection layer 66 of polysilicon due to the differences in the material. Additionally, if the protection layer 66 is polysilicon and the contact layer germanium, it may be easier to remove the polysilicon as compared to a protection layer 66 of germanium due to the differences in the material. This is because a selective etch technique can be employed that etches one of the polysilicon or germanium at a relatively greater rate as compared to the rate of the other material. During the etch step 140, the T-gate structure 80 loses about the same thickness as the thickness of the protection layer 66 if the same material is employed for the contact material and the protection layer 66 to result in a T-gate structure 82, as illustrated in FIG. 20. However, due to the thickness of the T-gate structure 80 the gate operation is not affected.

Figure 12:
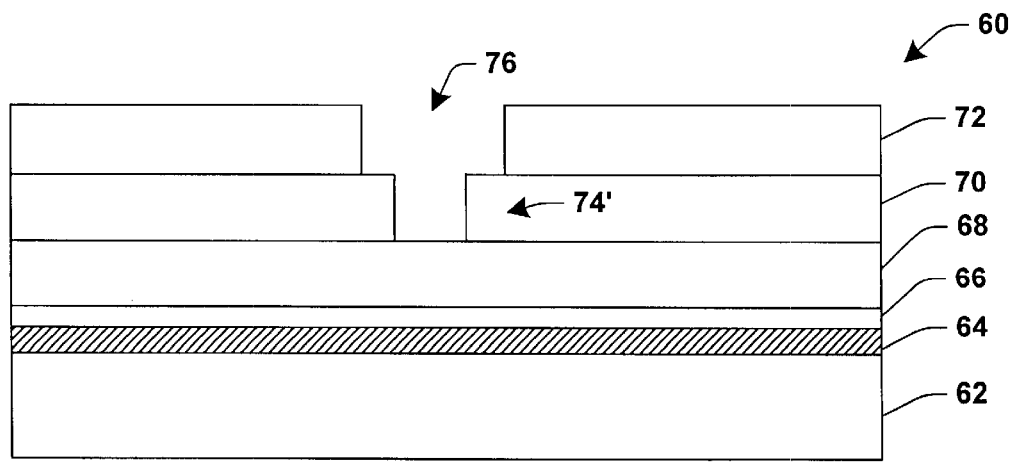
FIG. 12 is a schematic cross-sectional illustration of the structure of FIG. 11 after the opening in the photoresist layer has been expanded in accordance with one aspect of the present invention.
Figure 13:
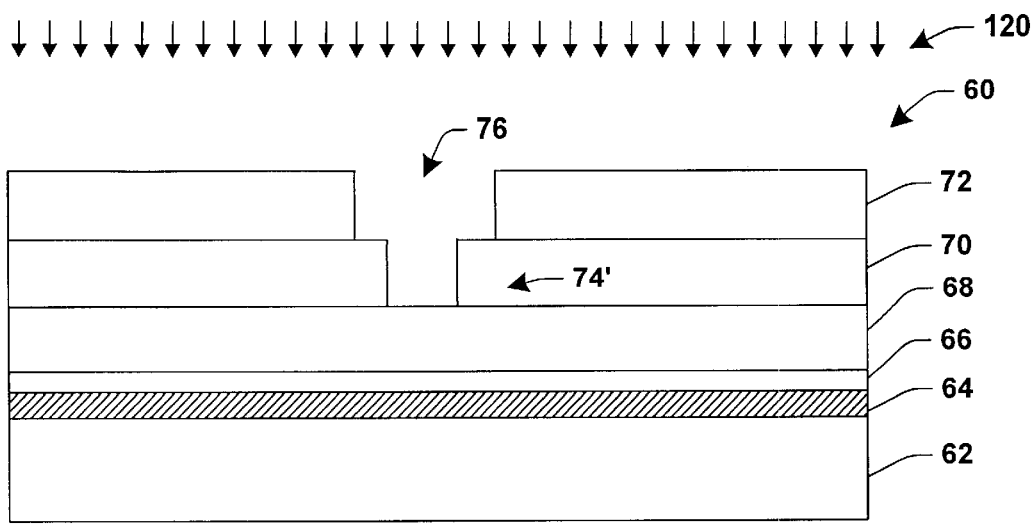
FIG. 13 is a schematic cross-sectional illustration of the structure of FIG. 12 undergoing yet another etching step to expand the opening in the second sacrificial and extend the opening through the first sacrificial layer in accordance with one aspect of the present invention.
Figure 21:
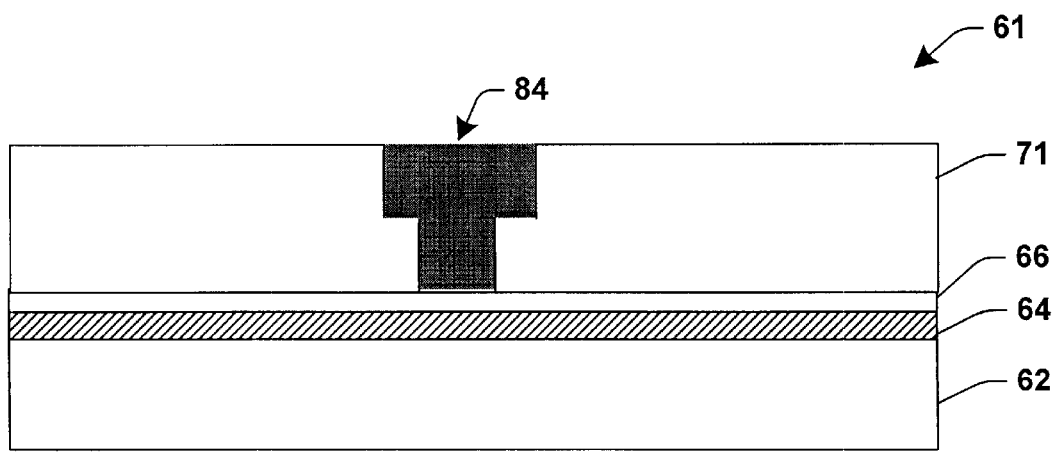
FIG. 21 is a schematic cross-sectional illustration of the structure of FIG. 16 wherein only a single sacrificial layer is employed in accordance with one aspect of the present invention.

FIG. 21 illustrates an alternate aspect of the invention in which a T-gate structure 84 is provided by employing only a single sacrificial layer 71. All that is necessary in forming the T-gate structure 84 of FIG. 21 is providing a single sacrificial layer 71 to replace the first and second sacrificial layers 68 and 70, and performing a partial etch on the single sacrificial layer from the top surface of the single sacrificial layer to a first depth similar to the etch step illustrated in FIG. 9. Preferably, the partial etch is highly selective to the single sacrificial layer over the photoresist layer 72. The opening in the photoresist layer 72 is then expanded as illustrated in FIGS. 11 and 12. Then a second etch step is employed to extend the opening to the protection layer 66 and to expand the opening at the first depth to form a T-gate opening in the single sacrificial layer 71 similar to the etch step illustrated in FIG. 13. Preferably, the second etch is highly selective to the single sacrificial layer over the photoresist layer 72 and the underlying protection layer 66. FIG. 21 illustrates the state of a structure 61 employing the single sacrificial layer 71 at a similar state as the structure 60 in FIG. 16. The remaining steps illustrated in FIGS. 17–19 may be employed to form the T-gate structure 84 similar to the T-gate structure 82 illustrated in FIG. 20.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a T-gate structure comprising the steps of: providing a silicon layer having a gate oxide layer, a protection layer over the gate oxide layer, a first sacrificial layer over the protection layer and a second sacrificial layer over the first sacrificial layer;

forming a photoresist layer over the second sacrificial layer;

forming an opening in the photoresist layer;

forming an opening in the second sacrificial layer beneath the opening in the photoresist layer;

expanding the opening in the photoresist layer to expose portions of the top surface of the second sacrificial layer around the opening in the second sacrificial layer;

extending the opening of the second sacrificial layer through the first sacrificial layer and expanding the opening in the second sacrificial layer to form a T-shaped opening in the first and second sacrificial layers;

removing the photoresist layer; and filling the T-shaped opening with a conductive material.

2. The method of claim 1, the first sacrificial layer and the second sacrificial layer including at least two of silicon oxide, silicon dioxide, silicon nitride ($Si_3N_4$), (SiN), silicon oxynitride, ($SiO_xN_y$), fluonated silicon oxide ($SiO_xF_y$), and polyimide(s) wherein the first sacrificial layer is formed from a different material than the second sacrificial layer.

3. The method of claim 1, the step of filling the T-shaped opening with a conductive material comprising the step of depositing one of polysilicon, germanium, amorphous polysilicon and metal in the T-shaped opening.

4. The method of claim 1, further comprising the step of removing the first and second sacrificial layers.

5. The method of claim 4, the step of removing the first and second sacrificial layers comprising stripping the first and second sacrificial layers employing an anisotropic gaseous stripping process.

6. The method of claim 5, further comprising the step of removing portions of the protection layer and the gate oxide layer not forming a part of the T-gate structure.

7. The method of claim 6, the step of removing portions of the protection layer and the gate oxide layer not forming a part of the T-gate structure comprising the step of performing an etch on the protection layer and the gate oxide layer.

8. The method of claim 7, the etch on the protection layer and the gate oxide layer being one of a wet etch and a vertical plasma etch.

9. The method of claim 5, further comprising the step of removing portions of the protection layer and the gate oxide layer not forming a part of the T-gate structure using one of a wet etch and a vertical plasma etch.

10. The method of claim 1, the step of forming an opening in the photoresist layer comprising performing a first resist etch on the photoresist layer that is highly selective to the photoresist layer over the underlying second sacrificial layer.

11. The method of claim 1, the step of forming an opening in the second sacrificial layer beneath the opening in the photoresist layer comprising the step of etching the second sacrificial layer with an etch that is highly selective to the second sacrificial layer over the photoresist layer and the underlying first sacrificial layer.

12. The method of claim 1, the step of expanding the opening in the photoresist layer comprising the step of etching the photoresist opening with an oxygen plasma etch.

13. The method of claim 1, the step of extending the opening of the second sacrificial layer through the first sacrificial layer and expanding the opening in the second sacrificial layer to form a T-shaped opening in the first and second sacrificial layers comprising the step of etching the opening in the second sacrificial layer with an etch that is highly selective to the first and second sacrificial layers over the photoresist layer and the underlying protection layer.

14. The method of claim 1, the protection layer being formed from one of polysilicon and germanium.

15. A method for fabricating a T-gate structure comprising the steps of: providing a silicon layer having a gate oxide layer, a protection layer over the gate oxide layer and a single sacrificial layer over the protection layer;
   forming a photoresist layer over the single sacrificial layer;
   etching an opening in the photoresist layer exposing a portion of the single sacrificial layer;
   etching the exposed portion of the single sacrificial layer to extend the opening partially into the single sacrificial layer, the opening in the single sacrificial layer extending from a top surface of the single sacrificial layer to a first depth;
   expanding the opening in the photoresist layer to expose portions of the top surface of the single sacrificial layer around the opening in the single sacrificial layer;
   etching the opening in the expanded opening in the photoresist layer to extend the opening of the single sacrificial layer through the single sacrificial layer to the protection layer and expand the opening in the single sacrificial layer at the first depth to form a T-shaped opening in the single sacrificial layer;
   removing the photoresist layer; and
   filling the T-shaped opening with a conductive material.

16. The method of claim 15, the single sacrificial layer including at least one of silicon oxide, silicon dioxide, silicon nitride ($Si_3N_4$), (SiN), silicon oxynitride, ($SiO_xN_y$), fluonated silicon oxide ($SiO_xF_y$), and polyimide(s).

17. The method of claim 15, the step of filling the T-shaped opening with a conductive material comprising the step of depositing one of polysilicon, germanium, amorphous polysilicon and metal in the T-shaped opening.

18. The method of claim 15, further comprising the step of removing the single sacrificial layer employing an anisotropic gaseous stripping process.

19. The method of claim 14, the step of expanding the opening in the photoresist layer comprising the step of etching the photoresist opening with an oxygen plasma etch.

20. A method for fabricating a T-gate structure comprising the steps of:
   providing a silicon layer having a gate oxide layer, a protection layer over the gate oxide layer, a first sacrificial layer over the protection layer and a second sacrificial layer over the first sacrificial layer;
   forming a photoresist layer over the second sacrificial layer;
   etching an opening in the photoresist layer exposing a portion of the second sacrificial layer, the etching being highly selective to the photoresist layer over the underlying second sacrificial layer;
   etching the exposed portion of the second sacrificial layer to extend the opening into the second sacrificial layer, the etching being highly selective to the second sacrificial layer over the photoresist layer and the underlying first sacrificial layer;
   expanding the opening in the photoresist layer to expose portions of the top surface of the second sacrificial layer around the opening in the second sacrificial layer using an oxygen plasma etch;
   etching the opening of the second sacrificial layer through the first sacrificial layer and expanding the opening in the second sacrificial layer to form a T-shaped opening in the first and second sacrificial layers, the etching being highly selective to the second sacrificial layer and the first sacrificial layer over the photoresist layer and the underlying protection layer;
   removing the photoresist layer;
   filling the T-shaped opening with a conductive material;
   removing the first and second sacrificial layers employing an anisotropic gaseous stripping process; and
   removing portions of the protection layer and the gate oxide layer not forming a part of the T-gate structure by performing an etch on the protection layer and the gate oxide layer using a wet etch.

* * * * *